United States Patent
Velez et al.

(10) Patent No.: US 6,266,377 B1
(45) Date of Patent: Jul. 24, 2001

(54) METHOD OF TIMING RECOVERY CONVERGENCE MONITORING IN MODEMS

(75) Inventors: Edgar Velez, Kanata; Ian Dublin, Ottawa, both of (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/076,634

(22) Filed: May 12, 1998

(51) Int. Cl.$^7$ .................................................. H04L 23/02
(52) U.S. Cl. .......................... 375/261; 375/326; 375/354; 375/371; 329/304
(58) Field of Search ..................... 375/222, 261, 375/326, 354, 355, 371; 329/304, 307, 308

(56) References Cited

U.S. PATENT DOCUMENTS

| | | | |
|---|---|---|---|
| 4,866,395 | * 9/1989 | Hostetter | 329/309 |
| 5,168,505 | * 12/1992 | Akazawa et al. | 375/1 |
| 5,369,411 | * 11/1994 | Lisle, Jr. | 342/194 |
| 5,388,127 | 2/1995 | Scarpa . | |
| 5,517,526 | 5/1996 | Caudron et al. . | |
| 5,521,939 | * 5/1996 | Miyachi et al. | 375/222 |
| 5,703,905 | 12/1997 | Langberg . | |
| 5,717,722 | * 2/1998 | Mori | 375/326 |
| 5,862,191 | * 1/1999 | Moridi | 375/355 |
| 5,933,460 | * 8/1999 | Lee | 375/324 |
| 6,002,723 | * 12/1999 | Chethik | 375/317 |
| 6,009,317 | * 12/1999 | Wynn | 455/296 |
| 6,052,423 | * 4/2000 | Blois et al. | 375/355 |
| 6,122,325 | * 9/2000 | Mogre et al. | 375/261 |

OTHER PUBLICATIONS

Degermark, Mikael et al., *Small Forwarding Tables for Fast Routing Lookups*, Department of Computer Science and Electrical Engineering, LuleåUniversity of Technology, S–971 87 Luleå, Sweden.

Waldvogel, Marcel et al., *Scalable High Speed IP Routing Lookups*, Computer Engineering and Networks Laboratory, ETH Zürich, Switzerland; Computer and Communications Research Center, Washington University in St. Louis, USA.

* cited by examiner

Primary Examiner—Stephen Chin
Assistant Examiner—Dac V. Ha
(74) Attorney, Agent, or Firm—Max R. Wood; Swabey Ogilvy Renault

(57) ABSTRACT

A method of timing recovery convergence monitoring in modems using an average phase error signal. The method involves continuously tracking the peak of the average phase error. The average phase error is compared to a dynamic threshold (i.e. a threshold that can change over time based on changes to the detected peak at a given time). Convergence is declared when the average phase error remains less than the threshold over a given length of time (i.e. after processing a prescribed number of consecutive samples).

12 Claims, 4 Drawing Sheets

METHOD OF TIMING RECOVERY CONVERGENCE MONITORING IN MODEMS

FIELD OF THE INVENTION

This invention relates to the field of timing recovery in modems and in particular to a method of detecting timing recovery convergence in a receiver of a modem.

BACKGROUND OF THE INVENTION

In communication systems a modem is used to convert (modulate) digital signals generated by a computer into analog signals suitable for transmission over telephone lines. Another modem, located at the receiving end of the transmission, converts (demodulates) the analog signals back into digital form. Timing recovery refers to, and includes, the generation and/or reconstruction of a clock signal, at a receiver, to sample the incoming signal. The clock signal generated at the receiver end must agree in frequency with the transmitter clock at the sending end, and may also require proper phasing. Timing recovery includes techniques that make use of the received waveform to help recover timing.

To recover data from a Quadrature Amplitude Modulated (QAM) signal (for example), a receiver is required to convert the analog signal received into a digital signal and to distinguish between the individual symbols that comprise the signal bitstream. Symbol timing recovery is used to recover a clock signal at the symbol rate, or a multiple of the symbol rate, from the modulated waveform that is received. This clock signal may be used by the receiver to convert the continuous-time received signal into a discrete-time sequence of data symbols. Traditional recovery circuits are typically functionally limited to a small operating range. When the signal loss and distortion vary over a large dynamic range, the behaviour of the circuit changes dramatically due to the large variability in the circuits s-curve maximum amplitude for different channels.

An s-curve is a curve showing the output of a phase detector in a timing recovery circuit as the phase difference between a received signal phase and an ideal phase between 0 and $2\pi$. The amplitude of the s-curve can be viewed as a measure of the quality of the timing recovery. In particular, robust and accurate timing recovery in a modem receiver generates a large maximum amplitude of the s-curve. If the s-curve maximum amplitude is reduced (due to loss, distortion, etc.) it results in long acquisition times, and large phase jitter after acquisition. This problem is exacerbated by the use of various QAM constellations, slope equalizer settings, and by the presence of radio frequency interference (RFI) such as from commercial AM broadcasts.

These characteristics of recovery circuits make it difficult to determine when the recovery circuit has converged (i.e. when the circuit acquires lock). Circuit lock refers to obtaining a frequency match between a receiver oscillator to a transmitter clock. The phase (sampling phase) of the receiver clock is not the same as the transmitter clock, but it is the optimum phase that allows the recovery of the data. The optimum phase varies depending on the channel response.

SUMMARY OF THE INVENTION

An object of the present invention is to improve timing recovery convergence monitoring in modems.

In accordance with an aspect of the present invention there is provided a method of convergence detection in a timing recovery circuit of a modem receiver for processing input quadrature amplitude modulation (QAM) signals having an in-phase component and a quadrature-phase component, said method comprising: (a) calculating an average phase error from the input QAM signal; (b) comparing the average phase error with a dynamic threshold; and (c) declaring convergence when the average phase error remains less than the dynamic threshold over a given length of time.

In accordance with another aspect of the present invention there is provided a method of timing recovery convergence monitoring comprising: (a) processing a prescribed set of symbols defined by an in-phase component and a quadrature-phase component; (b) calculating an I component phase error; (c) calculating a Q component phase error; (d) adding the I component phase error to the Q component phase error to obtain an instantaneous phase error; (e) integrating the instantaneous phase error over time to obtain an average phase error; (f) tracking a peak of the average phase error; (g) comparing the average phase error with a threshold, said threshold being a function of the peak of the average phase error at a given time; and (h) declaring convergence when the average phase error remains less than the threshold over a given length of time.

BRIEF DESCRIPTION OF THE DRAWINGS

The present invention will be described in conjunction with the drawings in which.

DETAILED DESCRIPTION OF EMBODIMENTS OF THE INVENTION

Figure 1:
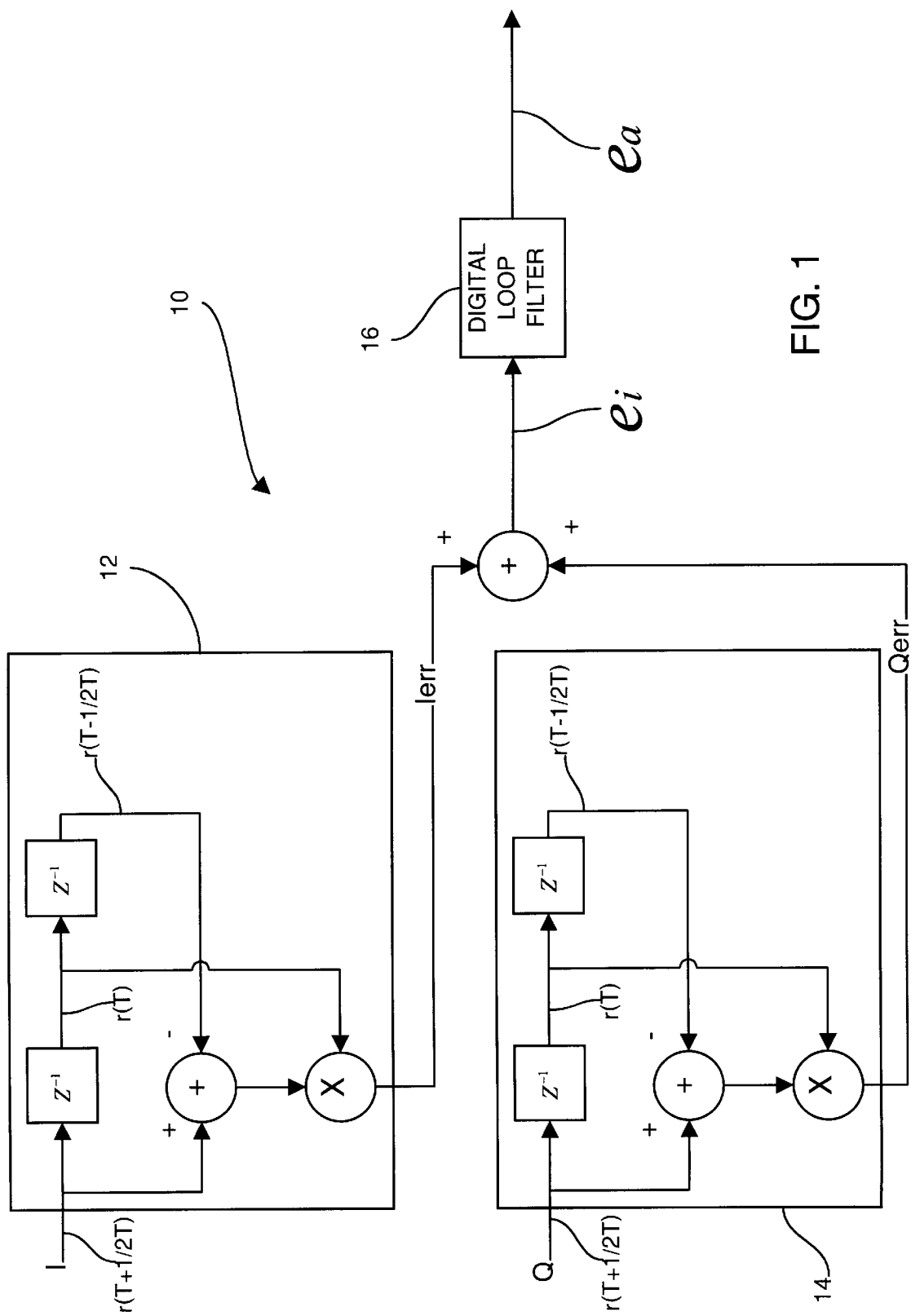
FIG. 1 illustrates a block diagram of a phase error detection module and a digital loop filter that are components of a timing recovery circuit in a receiver circuit for a modem.

A block diagram of a phase error detection module 10 and a digital loop filter 16 that are used in the convergence detection method of the present invention is shown in FIG. 1. Various embodiments of receivers incorporating phase detection circuitry are disclosed in co-pending U.S. patent application titled "Timing Recovery Loop Circuit in a Receiver of a Modem" filed concurrently with the present application and is hereby incorporated by reference. The phase error detection module 10, the digital loop filter 16 and an analog loop filter (not shown) provide a signal that controls an oscillator of a receiver, and compensates for frequency drifts between a transmit oscillator and the receive oscillator. Timing information is derived from the output of a Nyquist filter (a digital matched filter) known in the art. In particular, a QAM signal is processed by the Nyquist filter to demodulate the QAM signal from a passband spectrum to a baseband spectrum, which is composed of real and imaginary components (i.e. an in-phase (I) signal and a quadrature-phase signal (Q)). The signals (I and Q) are processed by the timing recovery module 10.

Two phase error estimations are performed by the module 10. A phase error term (Ierr) is estimated in block 12 from the in-phase (I) signal. The phase error term (Ierr) from the in-phase samples is defined by equation Eq. 1. The $Z^{-1}$ blocks in FIG. 1 represent shifts in the received data samples r, which are sampled at twice the symbol rate, therefore $Z^{-1}$ represents half a symbol duration.

$$Ierr=[\{r_i(T+\tfrac{1}{2}T)-r_i(T-\tfrac{1}{2}T)\}\times r_i(T)] \qquad \text{Eq. 1}$$

where T=symbol period and $r_i$ represent complex in-phase (I) received data samples.

Another phase error term (Qerr) is estimated in block 14 from the quadrature-phase (Q) signal. The phase error term (Qerr) from the quadrature samples is defined by equation Eq. 2.

$$Qerr=[\{r_q(T+\tfrac{1}{2}T)-r_q(T-\tfrac{1}{2}T)\}\times r_q(T)] \qquad \text{Eq. 2}$$

where T=symbol period and $r_q$ represent complex quadrature-phase (Q) received data samples.

For a single undistorted received symbol impulse, the received data points that are half a symbol before $\{r(T-\tfrac{1}{2}T)\}$ and hag a symbol after $\{r(T+\tfrac{1}{2}T)\}$ the peak r(T) should be equal in the average if the timing is correct (r is used to generically represent I and Q data samples). The center point r(T) is multiplied by the difference of the two outer points (refer to Eq.1 and Eq. 2).

The phase error terms (Ierr and Qerr) are added together to produce an instantaneous phase error ($e_i$). The $e_i$ is integrated over time by the digital loop filter 16 to produce an average phase error ($e_a$).

The filter 16 is a programmable digital loop filter that permits changes to pole and gain settings. The filter 16 is characterised by equation Eq. 3.

$$2^{-k_1} * \frac{1}{1-(1-2^{-k_2})Z^{-1}} \qquad \text{Eq. 3}$$

where parameter $k_1$ controls loop gain and parameter $k_2$ controls frequency pole of the filter 16.

Figure 2:
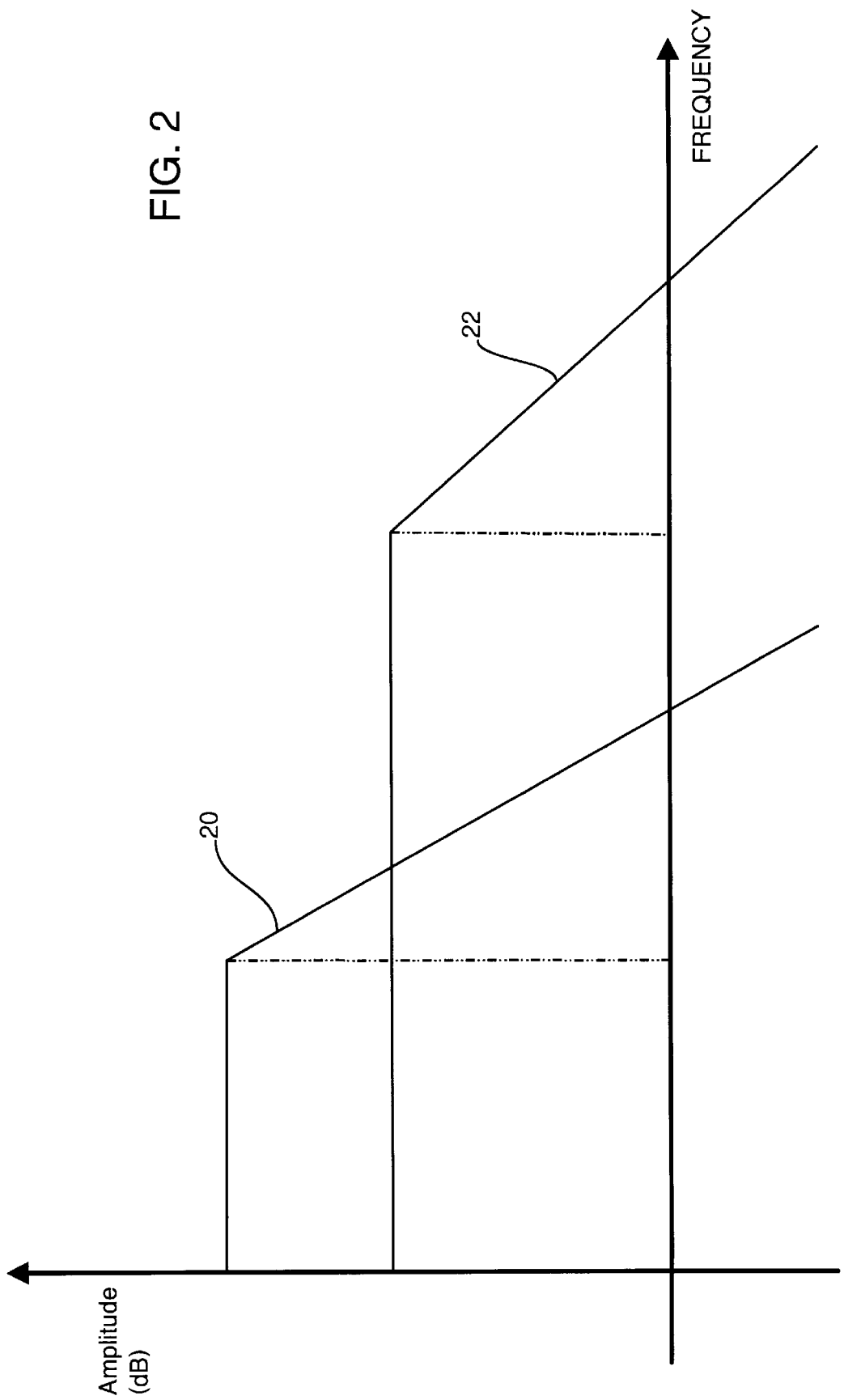
FIG. 2 illustrates various responses of a low pass filter shown in FIG. 1.

FIG. 2 illustrates a response 20 of filter 16 where gain ($k_1$) is high with a low frequency pole (i.e. large pole setting $k_2$); and a response 22 of filter 16 where gain ($k_1$) is low with a high frequency pole (i.e. small pole setting $k_2$).

When the filter pole setting $k_2$ is small (i.e. high frequency pole) the average phase error $e_a$ tends to exhibit a large jitter with high frequency content in a steady state. When the filter pole setting $k_2$ is large (i.e. low frequency pole) the average phase error $e_a$ tends to exhibit small jitter in the steady state.

The average phase error $e_a$ converges to a static value close to zero when in lock, and is continually operating to maintain a static constellation. The two main operating conditions of the digital loop filter 16 are (1) initialization/ acquisition mode: start with high frequency pole (i.e. small $k_2$) and high loop gain (i.e. small $k_1$) for fast convergence/ acquisition and a wide frequency tracking range; and (2) steady state mode: after convergence, switch (i.e. increase $k_2$) to low pole and low gain (increase $k_1$) for small jitter and slower tracking.

Figure 3:
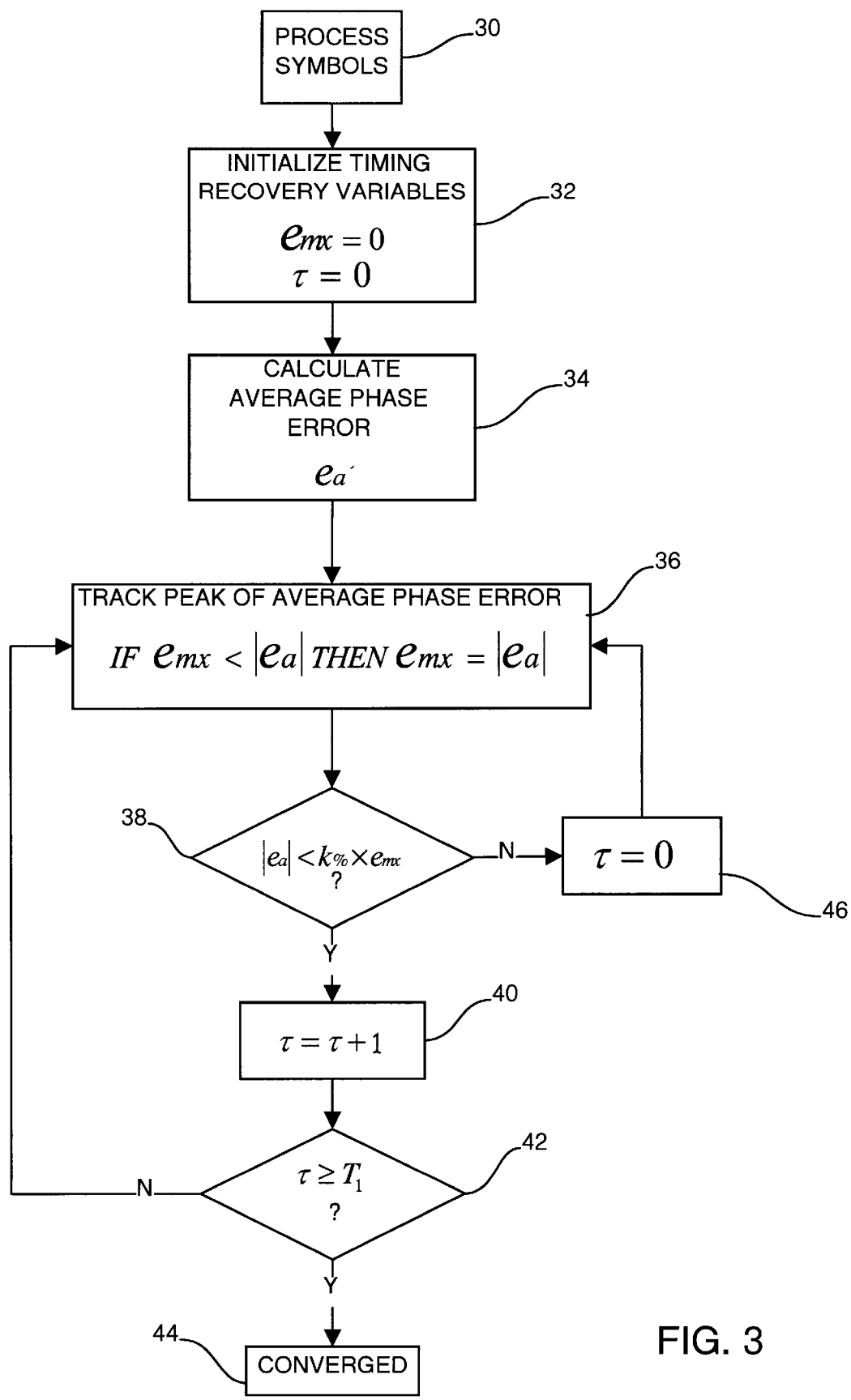
FIG. 3 illustrates a flow chart showing the steps of convergence detection in accordance with the present invention.
Figure 4:
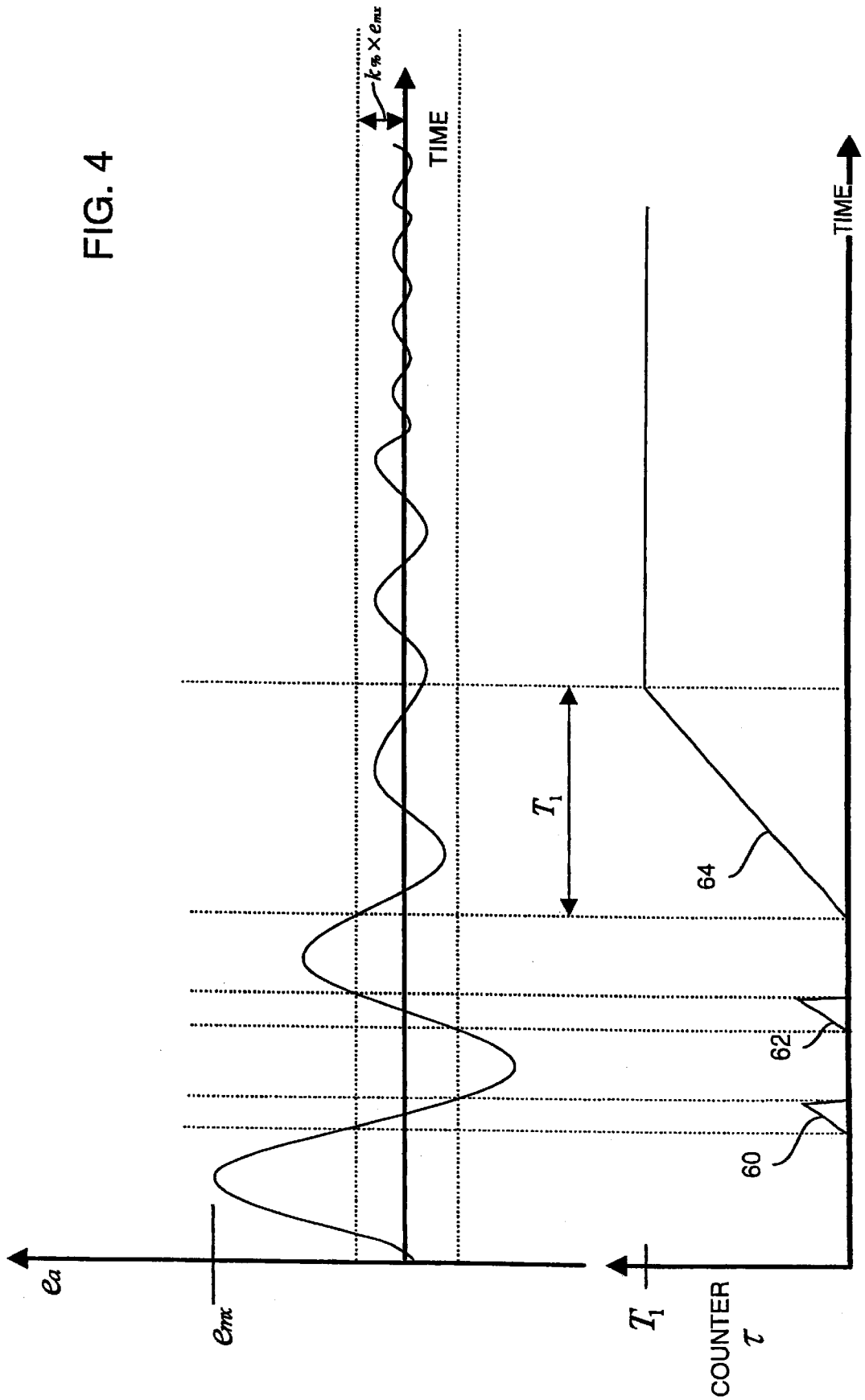
FIG. 4 illustrates a graph of average phase error versus time and a graph of a timing counter versus time as the receiver circuit converges showing the process of convergence monitoring.

A convergence detection method according to the present invention is illustrated in the flow chart of FIG. 3 and the graphs of FIG. 4. Symbols are processed through the phase error detection module 10 at step 30. A set of timing recovery variables (a maximum average phase error:$e_{mx}$ and a timing counter a) are initialized to zero at step 32. The average phase error $e_a$ is calculated at step 34 as discussed above with reference to FIG. 1.

The maximum average phase error $e_{mx}$ is tracked in step 36. Specifically, if $e_{mx}$ is less than $|e_a|$ then $e_{mx}$ is assigned the value of $|e_a|$ (i.e. if $e_{mx}<|e_a|$ then $e_{mx}=|e_a|$).

The absolute value of the average phase error $\{|e_a|\}$ is compared to a dynamic threshold $k_\%\times e_{mx}$ at step 38. The threshold is dynamic since $e_{mx}$ is continually being tracked and updated as operating conditions change. The threshold scaling parameter $k_\%$ is assigned a value as a design choice with various contributing factors including accuracy requirements etc. Typically, $k_\%$ would be assigned a value between 10% and 50%.

The timing counter τ is reset to zero at step 46 every time the absolute average phase error $|e_a|$ is equal to or greater than the dynamic threshold $k_\%\times e_{mx}$, where $e_{mx}$ is the current maximum detected average phase error. After step 46, processing returns to step 36 for continued peak tracking. The timing counter τ is incremented by one at step 40 every time the average phase error $|e_a|$ falls below the dynamic threshold $k_\%\times e_{mx}$. Convergence is declared at step 44 when τ reaches a prescribed time period $T_1$ as determined at step 42. In particular, convergence is declared when the average phase error $|_a|$ remains below the dynamic threshold for a sufficient period of time $T_1$ (i.e. for a predefined number of consecutive samples).

The graph of FIG. 4 illustrates the convergence detection method of the present invention for a specific average phase error profile. The top graph illustrates a typical profile of the average phase error over time. The bottom graph illustrates the operation of the timing counter τ. The graphs are not drawn to scale and are representative illustrations only to illustrate the concept of convergence monitoring. Counter increment sets 60, 62 and 64 show that the counter τ is incremented by one every sample whence $|e_a|<k_\%\times e_{mx}$ (the dynamic threshold for the time period under consideration is shown by the two horizontal lines in the top graph). For counter increment sets 60 and 62 the counter is reset to zero when $|e_a|\geq k_\%\times e_{mx}$. For counter increment set 64 the counter τ is incremented until the timing threshold $T_1$ is reached at which time convergence is declared.

The method of convergence detection of the present invention involves tracking the maximum of the absolute average phase error. A reference or threshold such as a percentage of the peak average phase error is used to indicate convergence or lock when $|e_a|$ remains below the threshold for a given period of time $T_1$. The present invention exploits the fact that the QAM signal has built in timing information (i.e. the symbol rate). The average phase error values across time (during convergence) trace the values of an s-curve. Therefore, by tracking the peak of the average phase error during convergence, the maximum amplitude of the s-curve is also detected. The maximum amplitude of the s-curve varies greatly depending on the type of channel etc. The maximum value is then used as a reference, and knowing that the optimum sampling point on the s-curve is when it is small (i.e. crosses zero), the average phase error can be monitored and lock/convergence can be declared when it remains consistently small, i.e. below $k_\%\times e_{mx}$ for a period of time $T_1$.

In summary, the phase error detection module processes the input signal waveform to calculate an average phase error signal that is compared to a dynamic threshold to detect convergence/lock. The receiver is considered locked/ converged when the output $e_a$ of the phase error detector is small relative to the maximum average phase error for a sufficient period of time. The magnitude of the error is always relative, since the error magnitude will depend on the channel characteristics, and what is small for one channel could be large for another, which reflects also on the corresponding s-curve amplitude.

What is claimed is:

1. A method of convergence detection in a timing recovery circuit of a modem receiver for pressing input quadrature amplitude modulation (QAM) signals having an in-phase component and a quadrature-phase component, said method comprising:
   (a) estimating an average phase error from the input QAM signal;
   (b) continuously tacking a maximum average phase error;
   (c) comparing the estimated average phase error with a dynamic threshold, wherein the dynamic threshold is dependent on the maximum average phase error at a given time; and
   (d) declaring convergence when the average phase error remains less than the threshold over a given length of time.

2. The method of claim 1, wherein the dynamic threshold is defined as a scaling value multiplied by the maximum average phase error at the given time, wherein the scaling value is less than one.

3. The method of claim 2, wherein the scaling value is between 0.1 and 0.5.

4. The method of claim 2, wherein the given length of time represents a time required to acquire a sufficient number of consecutive samples based on the input QAM signals processed by the modem receiver.

5. The method of claim 2, wherein step (a) includes:
   (i) calculating an I component phase error (Ierr);
   (ii) calculating a Q component phase error (Qerr);
   (iii) adding the I component phase error to the Q component phase error to obtain an instantaneous phase error; and
   (iv) integrating the instantaneous phase error over time to obtain the average phase error.

6. The method of clam 5, wherein the step of calculating at step (i) is defined by:

$$Ierr = (-\{r_i(T+\tfrac{1}{2}T) - r_i(T-\tfrac{1}{2}T)\} \times r_i(T) -)$$

where T represents a symbol period and $r_i$ represents in-phase data samples of the in-phase signal.

7. The method of claim 6, wherein the step of calculating at step (ii) is defined by:

$$Qerr = (-\{r_q(T+\tfrac{1}{2}T) - r_q(T-\tfrac{1}{2}T)\} \times r_q(T) -)$$

where $r_q$ repesents quadrature-phase data samples of the quadrature-phase signal.

8. A method of timing recovery convergence monitoring comprising:
   (a) processing a prescribed set of symbols defined by an in-phase component and a quadrature-phase component;
   (b) calculating an I component phase error;
   (c) calculating a Q component phase error;
   (d) adding the I component phase error to the Q component phase error to obtain an instantaneous phase error;
   (e) integrating the instantaneous phase error over time to obtain an average phase error;
   (f) tracking a peak of the average phase error;
   (g) comparing the average phase error with a threshold, said threshold being a function of the peak of the average phase error at a given time; and
   (h) declaring convergence when the average phase error remains less than the threshold over a given length of time.

9. The method of claim 8, wherein the threshold is defined as a scaling value multiplied by the peak of the average phase error at a given time, wherein the scaling value is less than one.

10. The method of claim 8, wherein the scaling value is between 0.1 and 0.5.

11. The method of claim 8, wherein the step of calculating at step (b) is defined by:

$$\{r_i(T+\tfrac{1}{2}r) - r_i(T-\tfrac{1}{2}T)\} \times r_i(T)$$

where T represents symbol period and $r_i$ represents in-phase data samples of the in-phase signal.

12. The method of claim 11, wherein the step of calculating at step (c) is defined by;

$$\{r_q(T+\tfrac{1}{2}T) - r_q(T-\tfrac{1}{2}T)\} \times r_q(T)$$

where $r_q$ represents quadrature-phase data samples of the quadrature-phase signal.

* * * * *

UNITED STATES PATENT AND TRADEMARK OFFICE
CERTIFICATE OF CORRECTION

PATENT NO. : 6,266,377 B1
DATED : July 24, 2001
INVENTOR(S) : Edgar Velez et al.

It is certified that error appears in the above-identified patent and that said Letters Patent is hereby corrected as shown below:

Column 2,
Line 53, "and" should read -- which --.
Line 53, "The phrase error…" should be the beginning of a new paragraph.

Column 3,
Line 67, "$|e_a|$ (i.e. if $e_{mx}<|e_a|$ then $e_{mx}=|e_a|$)." should read
-- $|e_a|$ (i.e. if $e_{mx}<|e_a|$ then $e_{mx}=|e_a|$). --.

Column 5,
Line 9, "tacking" should read -- tracking --.

Column 6,
Line 3, "repesents" should read -- represents --.

Signed and Sealed this

Twenty-first Day of September, 2004

JON W. DUDAS
*Director of the United States Patent and Trademark Office*